United States Patent
Bertram et al.

(10) Patent No.: US 9,722,636 B2
(45) Date of Patent: Aug. 1, 2017

(54) ARRANGEMENT AND METHOD FOR DECODING A DATA WORD WITH THE AID OF A REED-MULLER CODE

(71) Applicant: Eberhard Karls Universitaet Tuebingen, Tuebingen (DE)

(72) Inventors: Juliane Bertram, Bietigheim-Bissingen (DE); Michael Huber, Tuebingen (DE); Peter Hauck, Balingen (DE)

(73) Assignee: Eberhard Karls Universitaet Tuebingen, Tuebingen (DE)

( * ) Notice: Subject to any disclaimer, the term of this patent is extended or adjusted under 35 U.S.C. 154(b) by 0 days.

(21) Appl. No.: 14/765,525

(22) PCT Filed: Jan. 24, 2014

(86) PCT No.: PCT/DE2014/000027
§ 371 (c)(1),
(2) Date: Aug. 3, 2015

(87) PCT Pub. No.: WO2014/117764
PCT Pub. Date: Aug. 7, 2014

(65) Prior Publication Data
US 2015/0372696 A1  Dec. 24, 2015

(30) Foreign Application Priority Data

Feb. 1, 2013  (DE) .................. 10 2013 001 740

(51) Int. Cl.
*H03M 13/43* (2006.01)
*H03M 13/13* (2006.01)
(Continued)

(52) U.S. Cl.
CPC ......... *H03M 13/43* (2013.01); *H03M 13/136* (2013.01); *H03M 13/373* (2013.01); *H03M 13/6561* (2013.01); *H03M 13/6575* (2013.01)

(58) Field of Classification Search
CPC ............... H03M 13/43; H03M 13/136; H03M 13/6561; H03M 13/6575
See application file for complete search history.

(56) References Cited

U.S. PATENT DOCUMENTS 3,818,442 A * 6/1974 Solomon ................. G06F 7/724
714/781
4,933,956 A * 6/1990 Forney, Jr. ........ H03M 13/1505
375/285

(Continued)

FOREIGN PATENT DOCUMENTS

WO    WO 01/76077 A2    10/2001

OTHER PUBLICATIONS

International Search Report (PCT/ISA/210) dated Jul. 21, 2014 with English translation (six pages).
(Continued)

*Primary Examiner* — Joseph D Torres
(74) *Attorney, Agent, or Firm* — Crowell & Moring LLP

(57) ABSTRACT

An arrangement for decoding a data word using a Reed-Muller code, has: (1) N input terminals, (2) a first level of E>>D summing modules, each summing module being linked with F different input terminals and each input terminal being linked with E summing modules, (3) a first level of E decision modules, each of the D inputs of each decision module being linked respectively with an output from D different summing modules, (4) a second level of H summing modules, (5) a second level of G decision modules, (6) a third level of G summing modules, and (7) G output terminals. N signifies the code length and D signifies the minimum spacing of the code, E is equal to D-2, F is equal to N/D, G is the number of symbols of the data word that need to be corrected and is a natural number between 1 and E<<D.

10 Claims, 3 Drawing Sheets

(51) Int. Cl.
*H03M 13/00* (2006.01)
*H03M 13/37* (2006.01)

(56) References Cited

U.S. PATENT DOCUMENTS

| | | | | |
|---|---|---|---|---|
| 5,463,657 | A * | 10/1995 | Rice | H04J 13/12 375/150 |
| 5,926,488 | A | 7/1999 | Khayrallah | |
| 6,745,362 | B1 * | 6/2004 | Carlach | H03M 13/27 714/755 |
| 6,851,086 | B2 | 2/2005 | Szymanski | |
| 7,331,012 | B2 | 2/2008 | Vasic et al. | |
| 8,259,868 | B1 * | 9/2012 | Halford | H03M 13/1105 375/316 |
| 2002/0053062 | A1 * | 5/2002 | Szymanski | H03M 13/09 714/801 |
| 2003/0076912 | A1 * | 4/2003 | Linksy | H04L 27/22 375/376 |
| 2003/0103582 | A1 * | 6/2003 | Linsky | H04L 1/0045 375/327 |
| 2003/0112914 | A1 * | 6/2003 | Linsky | H04L 27/22 375/376 |
| 2003/0123595 | A1 * | 7/2003 | Linsky | H04L 1/0045 375/376 |
| 2004/0140914 | A1 * | 7/2004 | Aldridge | H04L 1/0039 341/50 |
| 2004/0193995 | A1 * | 9/2004 | Park | H03M 13/136 714/752 |
| 2006/0140313 | A1 * | 6/2006 | Futami | H04L 1/001 375/343 |
| 2009/0031195 | A1 * | 1/2009 | Tiong | H03M 13/136 714/781 |

OTHER PUBLICATIONS

German Office Action dated Jul. 29, 2013 (five pages).

J. Bertram et al., "An Improved Majority-Logic Decoder Offering Massively Parallel Decoding for Real-Time Control in Embedded Systems," IEEE Transactions on Communications, vol. 61, No. 12 (Dec. 2013), pp. 4808-4815, XP011534895.

C.-L. Chen, "On Majority-Logic Decoding of Finite Geometry Codes," IEEE Transactions on Information Theory, vol. 17, No. 3 (May 1971), pp. 332-336, XP002726723.

S. Lin et al, "Error Control Coding: Fundamentals and Applications, Finite Geometry Codes" (Jan. 1983), pp. 223-256, XP002390634.

I. Reed, "A Class of Multiple-Error-Correcting Codes and the Decoding Scheme," IRE Professional Group on Information Theory, IEEE; vol. 4 (Sep. 1954), pp. 38-49, XP011461957.

D.E. Muller, "Application of Boolean Algebra to Switching Circuit Design and to Error Detection," IRE Trans., EC-3, Sep. 1954, pp. 6-12.

I. Dumer, "Recursive Decoding and Its Performance for Low-Rate Reed-Muller Codes," IEEE Transactions on Information Theory, vol. 50, No. 5 (May 2004), pp. 811-823.

G. Schnabl et al., "Soft-Decision Decoding of Reed-Muller Codes as Generalized Multiple Concatenated Codes," IEEE Transactions on Information Theory, vol. 41, No. 1 (Jan. 1995), pp. 304-308.

C.-L. Chen, "Note on Majority-Logic Decoding of Finite Geometry Codes," IEEE Transactions on Information Theory, vol. 18 (1972), pp. 539-541.

* cited by examiner

ARRANGEMENT AND METHOD FOR DECODING A DATA WORD WITH THE AID OF A REED-MULLER CODE

BACKGROUND AND SUMMARY OF THE INVENTION

The present invention relates to an arrangement and a method for decoding a digital signal, referred to hereinafter as data word.

Arrangements and methods of this type are used in message transmission and data storage for the reconstruction of a message transmitted as an analog or digital signal, referred to hereinafter as code word.

A code word is a data sequence which is generated by adding redundancy to information according to a given specification, referred to hereinafter as code.

An information source such as, for instance, a storage element or a transmitter transmits a code word to a receiver by means of a channel. If said channel is noisy, the code word can be damaged. The data word and the code word are then different.

The decoder generates an output signal with the aid of the data word (FIG. 1). Said output signal can comprise the code word, the information or parts of the code word and/or of the information.

The decoding method according to the invention is an error-correcting measure for determining the code word or the information or parts thereof with the aid of the data word. This makes use of the fact that the information is stored in the code word in a redundant manner.

A code word and a data word consist in each case of N symbols. The information consists of K symbols. In the case of a systematic coding, the code word consists of the information and a redundancy data sequence, such that the information is directly readable from the code word. In the case of a non-systematic coding, the information is not directly readable from the code word.

The code additionally defines the so-called minimum distance D. If the number of symbols damaged during transmission is a maximum of (D-1)/2 a suitable decoder can unambiguously reconstruct the code word or the information or parts thereof.

Reed-Muller codes are a family of linear error-correcting codes. Provided that the decoder used supports this, the structure of the Reed-Muller codes allows both the entire information and parts of the information to be decoded very rapidly. Moreover, Reed-Muller codes permit a broad use for different applications since the block length N and the number as to how many errors can be corrected can be tailored to the respective application.

This class of codes was developed in 1954 by Irving S. Reed and David E. Muller (1), (2) (all citations to references ( ) are with respect to the "Literature/References" section of the application). The binary Reed-Muller code was used by NASA in the Mariner Expeditions (1969 to 1976) to Mars in order to send the photographs taken of Mars to Earth.

Reed-Muller codes have been used to a lesser extent in recent times because their information rates are generally lower than in other classes of codes. Since their structure allows a parallel decoding of the information, this class of codes is increasingly of interest for multicore applications.

Different types of decoding can occasionally also be applied in combination to this code class: e.g. hard decision decoders based on majority logic in (2), (6), (7) or recursive soft decision decoders, e.g. in (3), (4).

Majority Logic decoding comprises a plurality of stages of majority decisions. In a majority decision, the value which occurs the most frequently is communicated. This type of decoding has the advantage that it can be implemented very simply and primarily at the hardware level. In addition, majority decoding is very fast. In contrast to decodings that utilize the occasionally cyclic or recursively established structure of a code, parallel decoding of the entire information is possible in the case of majority decoding, with the result that the decoding time can be shortened.

The Reed algorithm (2) is a majority logic hard decision decoding method for Reed-Muller codes. This algorithm consists of (R+1) levels of majority decisions, wherein R increases with increasing information length K and with block length N remaining the same. Reed's method therefore requires a multiplicity of decision modules and cannot decode in constant parallel time.

The method described by Dumer (3) involves recursive decoding by carrying out computation steps that are few in number but build sequentially on one another. This results in a lengthened decoding time since calculations cannot be performed in parallel. Moreover, this method can only be realized with relatively complex components or a multiplicity of components at the hardware level, since it operates with fixed-point numbers.

The patent specification WO 0176077 A2 presents a decoding scheme that focuses on serial decoding using latches. The individual bits are decoded with the aid of switching networks that occasionally contain majority gates. Concrete computation steps for the decoding are not mentioned; instead, reference is made to established methods described in (5).

Lin and Costello describe in detail in (5) the prior art with regard to decoders for Reed-Muller codes. All the decoders mentioned therein require significantly more majority gates for decoding. In particular Lin and Costello also mention the method from Chen (6), (7), which requires the fewest majority gates among the parallel decoders presented in (5).

The method (6), (7) described by Chen can be implemented in hardware, although with more components and an increased space requirement. In particular, more majority decisions have to be taken.

The patent specification U.S. Pat. No. 5,926,488 A claims decoding only for second-order Reed-Muller codes, for which R=2 holds true. The method presented therein is likewise a recursive method that requires a multiplicity of components for realization.

The patent U.S. Pat. No. 7,331,012 B2 claims a system for decoding Reed-Muller-coded signals. The decoder essentially consists of a soft decision algorithm based on the Reed algorithm.

Therefore, the object of the present invention is to provide an arrangement and a method for efficient parallel real-time decoding (error detection and correction) of a data word which can be realized in hardware and with a simpler architecture and fewer components in comparison with the prior art.

This object is achieved by means of an arrangement and method according to embodiments of the invention.

The linear code used in the present invention is a binary Reed-Muller code or a code equivalent thereto. N shall denote the length, D the distance and K the dimension of the code. Furthermore, E and F shall be defined as follows: E=D-2 and F=N/D. The natural number G shall describe how many of the N symbols of the data word are intended to be corrected. H shall describe a natural number between 1 and ED.

The arrangement according to the invention consists of the following components (FIG. 2):

a. N input terminals, I1 to IN,
b. a first level of ED summing modules, SI_11 to SI_ED, wherein each summing module of the first level is linked with F different input terminals and each input terminal is linked with E summing modules of the first level,
c. a first level of E decision modules MI_1 to MI_E, wherein each of the D inputs of each decision module is linked with a respective output from D different summing modules from the first level of the summing modules,
d. a second level of H summing modules, SII_1 to SII_H, wherein each summing module is linked with a decision module from the first level of the decision modules and a summing module from the first level of the summing modules,
e. a second level of G decision modules, MII_1 to MII_G, wherein each of the E inputs of each decision module is linked with a respective output from E different summing modules from the second level of the summing modules,
f. a third level of G summing modules, SIII_1 to SIII_G, wherein each summing module is linked with exactly one decision module from the second level of the decision modules and an input terminal,
g. G output terminals, O1 to OG, wherein each output terminal is linked with exactly one summing module from the third level of the summing modules.
h. The concrete interlinking NI_1 to NI_E of the N input terminals I1 to IN with the summing modules of the first level SI_11 to SI_ED and the concrete interlinking NII_1 to NII_E of the summing modules of the second level SII_11 to SII_ED with the decision modules of the second level MII_1 to MII_G depend on the concrete code.

By way of example, the arrangement of the switching networks NI_1 to NI_E and NII_1 to NII_E for the Reed-Muller code RM(2,4) is illustrated and described in (FIG. 3). With the aid of the explanatory description on the basis of the exemplary embodiment RM(2,4), it is clearly evident to the person skilled in the art how the arrangements should be designed for other codes.

Preferably, G=N or G=K, such that either the entire code word or exclusively the entire information can be restored. Particularly preferably, H is equal to E·D.

The addition operations to be performed in the summing modules correspond to XOR operations. The summing modules of the first level 2) can be realized at the hardware level by odd-parity gates. The summing modules of the second level (4) and of the third level (6) can be implemented by XOR gates in the case of a binary code. Majority gates can be used for the decision modules of the first level (3) and second level (5). If E is equal to 2, then an AND gate can be used for the decision module.

Furthermore, the present invention relates to the method for decoding a data word with the aid of an error-correcting linear code. If the number of transferred symbols is disregarded, there are two types of modules which can be implemented in parallel or sequentially: I) summing modules add up in a binary manner all the symbols transferred to them and return the sum, that is to say one or zero; II) decision modules check for the frequency of the symbols transferred to it and return that symbol which occurs the most frequently.

The method according to the invention comprises the following steps, wherein the parameters N, E, D, F and G are as defined above:

a. reading in the data word, consisting of N symbols;
b. processing F symbols of the data word with the aid of a summing module to form a sum, wherein this step is performed E*D times by the same summing module or by different summing modules;
c. determining—on the basis of D sums from (b)—that sum which occurs the most frequently, wherein this step is performed E times by the same decision module or by different decision modules;
d. adding each sum determined in c) which is not equal to zero to up to D of the transferred sums from (b);
e. determining—on the basis of E sums calculated in (b) and/or (d)—that sum which occurs the most frequently, wherein this step is performed G times by the same decision module or by different decision modules;
f. adding each value determined in (e) which is not equal to zero to a symbol of the data word;
g. outputting the sums generated in (f).

The arrangement according to the invention has the major advantage that the underlying architecture constitutes a switching network rather than a switching circuit, as known from the prior art, and can be constructed with a small number of simple components. By way of example, no register or storage elements, no flip-flops or clock generators are required. In comparison with the conventional decoding method of the Reed-Muller code, the invention uses only two levels of decision modules with a total of not more G+E decision modules. As a result, not only are components and space saved, but the decoding time is shortened as well, such that all errors can be corrected by parallel decoding in real time.

Further advantages, features and application possibilities of the invention are described below on the basis of the exemplary embodiment described below with reference to the figures.

DETAILED DESCRIPTION OF THE DRAWINGS

Figure 1:
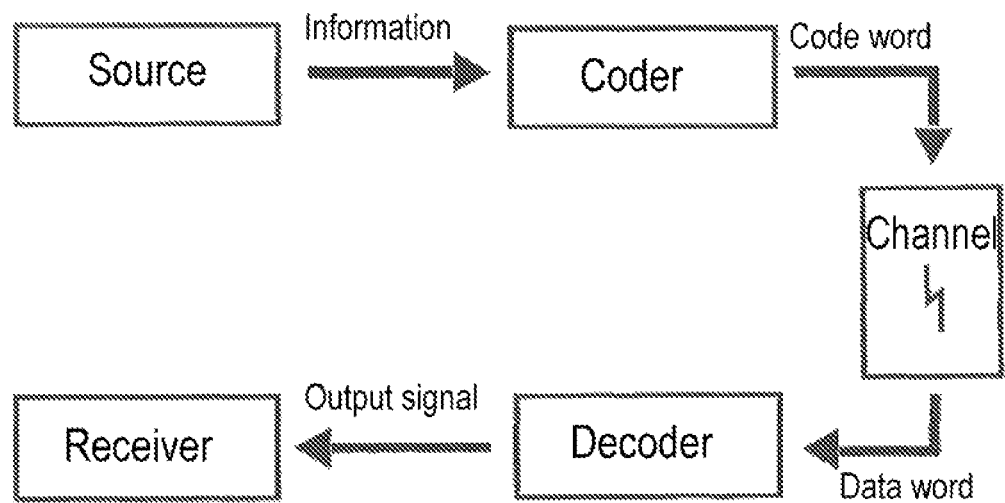
FIG. 1 is a schematic diagram illustrating a general scheme for channel coding and decoding.

FIG. 1 illustrates a general scheme for channel coding and decoding. The source (for instance a transmitter or a memory register) transmits the information to the coder. A code word is generated in the coder by the information being duplicated. The code word is transmitted via a channel. The code word can be damaged by the channel during transmission. The occasionally damaged code word, designated as data word, is forwarded to the decoder. In the decoder, the output signal is generated by means of the data word. Depending on the exemplary embodiment, the output signal can comprise the entire code word, the original information or part of the code word and/or of the information.

Figure 2:
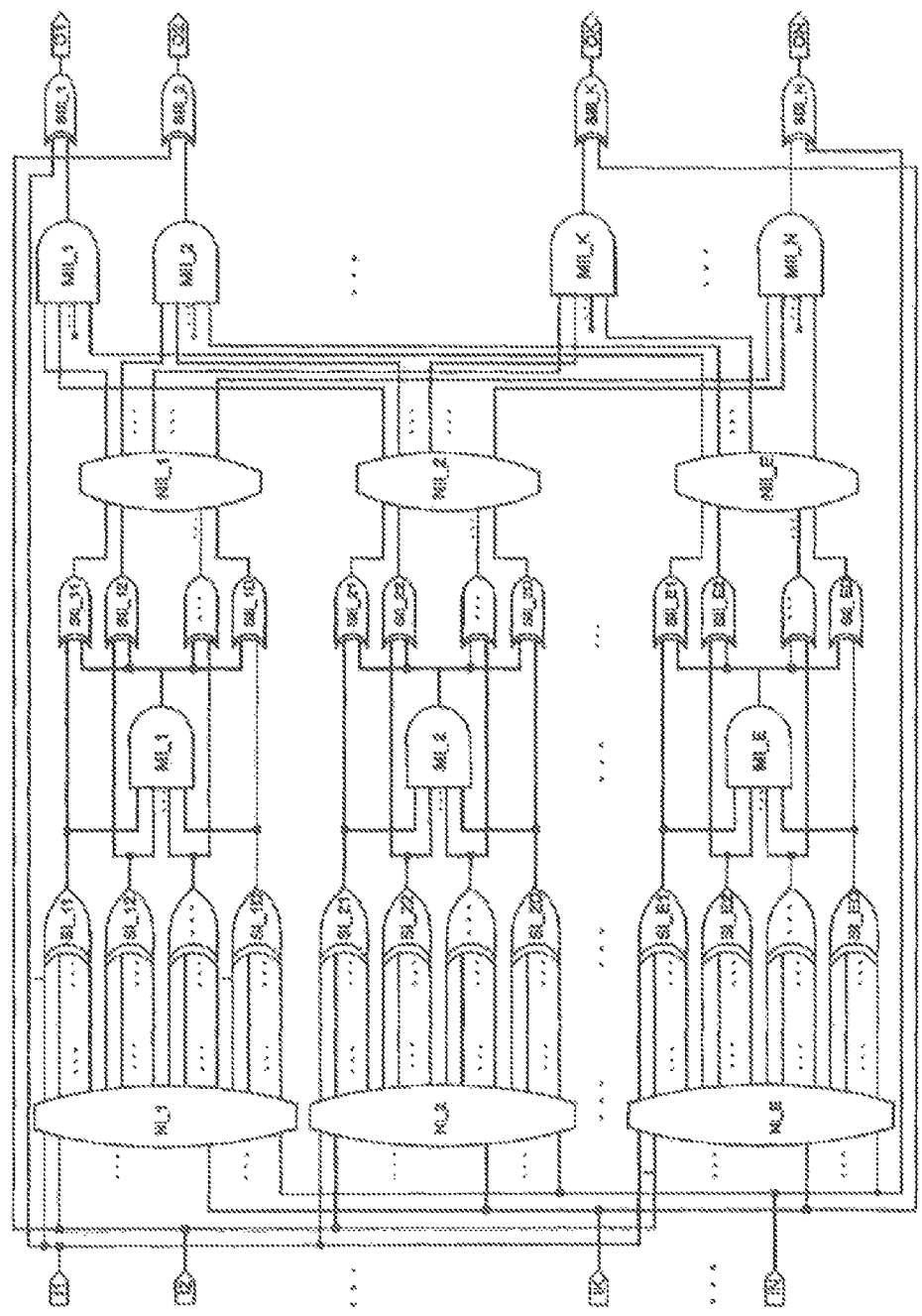
FIG. 2 is a logic diagram of an exemplary embodiment of the arrangement according to the invention for decoding.

FIG. 2 illustrates one exemplary embodiment of the arrangement according to the invention for decoding using a binary Reed-Muller code RM(r,m) in which G=N and H=E·D. The arrangement is divided into seven levels: (1) N input terminals, (2) ED summing modules, (3) E decision modules, (4) ED summing modules, (5) N decision modules, (6) N summing modules, (7) N output terminals. The signals of the input terminals (1) are transmitted to the summing modules SI_11 to SI_ED (2) by means of the switching networks NI_1 to NI_E. The summing modules (2) add up the signals and output the sum. The sums are passed to the decision modules MI_1 to MI_E (3). Each decision module (3) outputs that sum which it receives the most frequently. In the summing modules SII_11 to SII_ED (4), this sum received by a majority is added to the sums previously calculated in the summing modules (2). The signals output by the summing modules (4) are forwarded to the decision modules MII_1 to MII_N (5) by the switching networks NII_1 to NII_E. Each decision module (5) outputs that signal which it receives the most frequently. The signals output by the decision modules (5) are forwarded to the summing modules SIII_1 to SIII_N (6). In the summing modules (6), the signals of the input terminals (1) and the signals output by the decision modules (5) are added up and forwarded to the output terminals O1 to ON. If at most (D−1)/2 symbols of the data word have been damaged during transmission, then the totality of the signals present at the output terminals corresponds to the code word.

Figure 3:
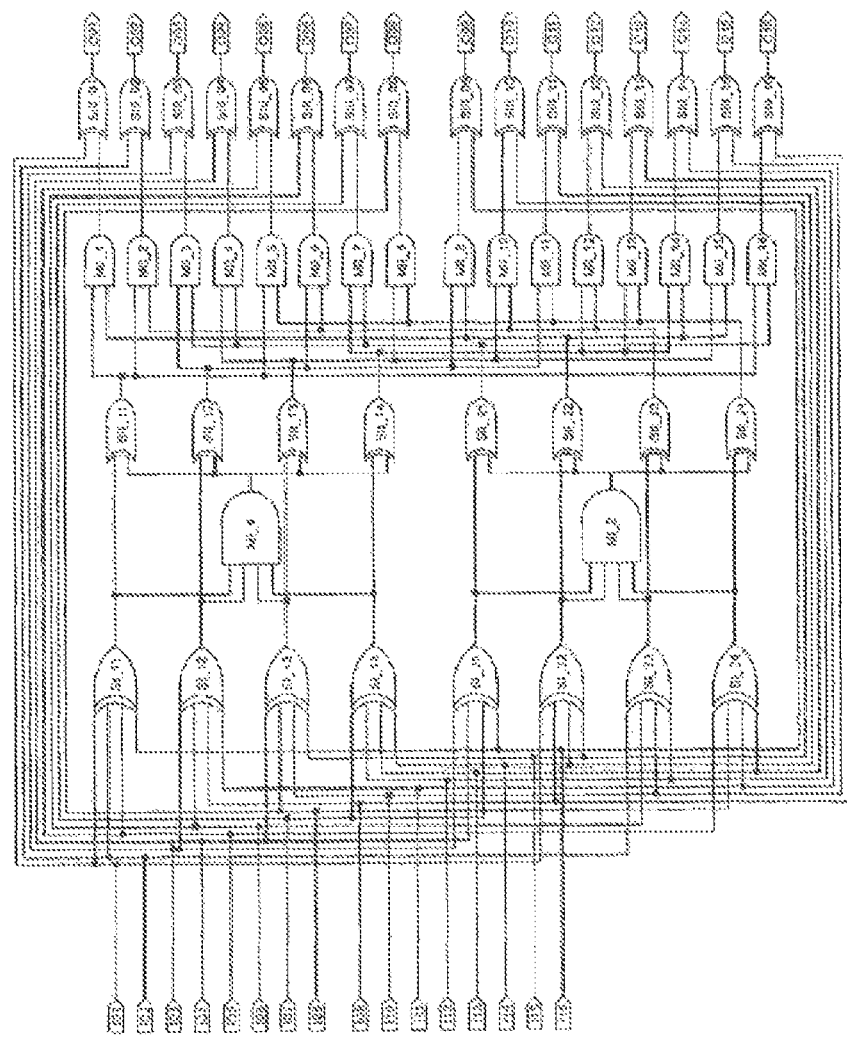
FIG. 3 is a logic diagram of an exemplary embodiment of the arrangement according to the invention for decoding.

FIG. 3: illustrates one exemplary embodiment of the arrangement according to the invention for decoding using a binary Reed-Muller code RM(2,4). It holds true that N=16, K=11, D=4, E=2, F=4, G=16 and H=8. The arrangement is divided into seven levels: (1) 16 input terminals; (2) 8 summing modules which in each case output whether the sum of the symbols of the linked input terminals is even or odd; (3) 2 decision modules, (4) 8 summing modules, (5) 16 decision modules, (6) 16 summing modules, (7) 16 output terminals. In each case 4 signals of the input terminals (1) are transmitted to each summing module SI_11 to SI_24 (2). The summing modules (2) add up the signals in a binary manner and output the sum, which is either 0 or 1. The sums are passed to the decision modules MI_1 and MI_2 (3). Each decision module (3) outputs that sum which it receives the most frequently. In the summing modules SII_11 to SII_ED (4), this sum received by a majority is added to the sums previously calculated in the summing modules (2). The signals output by the summing modules (4) are forwarded to the decision modules MII_1 to MII_16 (5) by. Each decision module (5) outputs that signal which it receives the most frequently. The signals output by the decision modules (5) are forwarded to the summing modules SIII_1 to SIII_16 (6). In the summing modules (6), the signals of the input terminals (1) and the signals output by the decision modules (5) are added up and forwarded to the output terminals O1 to O16. If at most one symbol of the data word has been damaged during transmission, then the totality of the signals present at the output terminals corresponds to the code word.

Exemplary Embodiment

If coding is carried out with the binary Reed-Muller code RM(2,4), then it holds true that: N=16, D=4, K=11, E=2, F=4. If the entire code word is intended to be reconstructed from the data word, then G=16.

The arrangement according to the invention then consists of the following components (see FIG. 3):

a. 16 input terminals I01 to I16,
b. a first level of eight summing modules, S_11 to S_24, wherein each input terminal is linked with two summing modules of the first level and each summing module of the first level is linked with four different input terminals,
c. a first level of two decision modules, MI_1 to MI_2, wherein each decision module is linked with 4 summing modules from the first level of the summing modules,
d. a second level of eight summing modules, SII_11 to SII_24, wherein each summing module is linked to a decision module from the first level of the decision modules and a summing module from the first level of the summing modules,
e. a second level of 16 decision modules, MII_01 to MII_16, wherein each decision module is linked to two summing modules from the second level of the summing modules,
f. a third level of G summing modules, SIII_01 to SIII_16, wherein each summing module is linked with exactly one decision module from the second level of the decision modules and an input terminal,
g. G output terminals, O01 to O16, wherein each output terminal is linked with exactly one summing module from the third level of the summing modules.
h. In order to determine the concrete interlinking, NI_1 to NI_2, of the 16 input terminals, I1 to I16, with the summing modules of the first level, SI_11 to SI_24, and the concrete interlinking, NII_1 to NII_2, of the summing modules of the second level, SII_11 to SII_24, with the decision modules of the second level, MII_1 to MII_N, some mathematical considerations are necessary.

Let GF(2) be the body having two elements, designated by 1 and 0. In particular it holds true that: 1+1=0. Let V:={(v1,v2,v3,v4)|v1,v2,v3,v4 in GF(2)}, a four-dimensional vector space over the body GF(2). In the vector space V there are 16 different vectors, let us say v01 to v16. We number them consecutively as desired.

The following numbering is chosen by way of example:
v01=(0, 0, 0, 1),
v02=(0, 0, 1, 0),
v03=(0, 1, 0, 0),
v04=(1, 0, 0, 0),
v05=(0, 0, 1, 1),
v06=(0, 1, 1, 0),
v07=(1, 1, 0, 0),
v08=(1, 0, 1, 1),
v09=(0, 1, 0, 1),
v10=(1, 0, 1, 0),
v11=(0, 1, 1, 1),
v12=(1, 1, 1, 0),
v13=(1, 1, 1, 1),
v14=(1, 1, 0, 1),
v15=(1, 0, 0, 1),
v16=(0, 0, 0, 0).

The intention is to design E=2 subvector spaces of V with F=4 elements which intersect only in the zero vector, here v16. By way of example, let U1:={v01, v02, v05, v16} and U2:={v03, v04, v07, v16}. For each subvector space, the 16 affine spaces are then considered which are obtained by translating the subspace by the different 16 vectors:
V011:=v01+U1={v01, v02, v05, v16},
V021:=v02+U1={v01, v02, v05, v16},
V031:=v03+U1={v03, v06, v09, v11},
V041:=v04+U1={v04, v08, v10, v15},
V051:=v05+U1={v01, v02, v05, v16},
V061:=v06+U1={v03, v06, v09, v11},
V071:=v07+U1={v07, v12, v13, v14},
V081:=v08+U1={v04, v08, v10, v15},
V091:=v09+U1={v03, v06, v09, v11},
V101:=v10+U1={v04, v08, v10, v15}, $V1_{11} := v1_1 + U_1 = \{v03, v06, v09, v11\}$,
$V1_{21} := v1_2 + U_1 = \{v07, v12, v13, v14\}$,
$V1_{31} := v1_3 + U_1 = \{v07, v12, v13, v14\}$,
$V1_{41} := v1_4 + U_1 = \{v07, v12, v13, v14\}$,
$V1_{51} := v1_5 + U_1 = \{v04, v08, v10, v15\}$,
$V1_{61} := v1_6 + U_1 = \{v01, v02, v05, v16\}$
and
$V0_{12} := v0_1 + U_2 = \{v01, v09, v14, v15\}$,
$V0_{22} := v0_2 + U_2 = \{v02, v06, v10, v12\}$,
$V0_{32} := v0_3 + U_2 = \{v03, v04, v07, v16\}$,
$V0_{42} := v0_4 + U_2 = \{v03, v04, v07, v16\}$,
$V0_{52} := v0_5 + U_2 = \{v05, v08, v11, v13\}$,
$V0_{62} := v0_6 + U_2 = \{v02, v06, v10, v12\}$,
$V0_{72} := v0_7 + U_2 = \{v03, v04, v07, v16\}$,
$V0_{82} := v0_8 + U_2 = \{v05, v08, v11, v13\}$,
$V0_{92} := v0_9 + U_2 = \{v01, v09, v14, v15\}$,
$V1_{02} := v1_0 + U_2 = \{v02, v06, v10, v12\}$,
$V1_{12} := v1_1 + U_2 = \{v05, v08, v11, v13\}$,
$V1_{22} := v1_2 + U_2 = \{v02, v06, v10, v12\}$,
$V1_{32} := v1_3 + U_2 = \{v05, v08, v11, v13\}$,
$V1_{42} := v1_4 + U_2 = \{v01, v09, v14, v15\}$,
$V1_{52} := v1_5 + U_2 = \{v01, v09, v14, v15\}$,
$V1_{62} := v1_6 + U_2 = \{v03, v04, v07, v16\}$.

Evidently, in each case F=4 of the affine spaces are always identical. Between the respective D=4 different affine spaces per subvector space and the summing modules of the first and second levels there is a unique correspondence describing the arrangement of the switching networks $NI\_{_6}1$ to $NI\_E$:

$V0_{11} = \{v01, v02, v05, v16\} <==> SI\_11, SII\_11$,
$V0_{31} = \{v03, v06, v09, v11\} <==> SI\_12, SII\_12$,
$V0_{41} = \{v04, v08, v10, v15\} <==> SI\_13, SII\_13$,
$V0_{71} = \{v07, v12, v13, v14\} <==> SI\_14, SII\_14$
and
$V0_{32} = \{v03, v04, v07, v16\} <==> SI\_21, SII\_21$,
$V0_{12} = \{v01, v09, v14, v15\} <==> SI\_22, SII\_22$,
$V0_{22} = \{v02, v06, v10, v12\} <==> SI\_23, SII\_23$
$V0_{52} = \{v05, v08, v11, v13\} <==> SI\_24, SII\_24$.

The input terminals I01, I02, I05, I16 are linked with the summing module SI\_11. The input terminals I03, I06, I09, I11 are linked with the summing module SI\_12. The input terminals I04, I08, I10, I15 are linked with the summing module SI\_13. The input terminals I07, I12, I13, I14 are linked with the summing module SI\_14.

Equivalently, the input terminals I03, I04, I07, I16 are linked with the summing module SI\_21. The input terminals I01, I09, I14, I15 are linked with the summing module SI\_22. The input terminals I02, I06, I10, I12 are linked with the summing module SI\_23. The input terminals I05, I08, I11, I13 are linked with the summing module SI\_24.

On the basis of the above correspondence between the affine spaces and the summing modules of the first level, it is possible to derive the arrangements of the switching networks NII\_1 to NII\_E. It is evident that each of the 16 vectors is contained in E=2 different affine spaces:

v01 in V011 and V012;
v02 in V011 and V022;
through to v16 in V011 and V032.

In accordance with this property, the decision module MII\_1 is linked with the summing modules SII\_11 and SII\_22 corresponding to V011 and V012. The decision module MII\_2 is linked with summing modules SII\_11 and SII\_23 corresponding to V011 and V022. This is continued schematically through to the decision module MII\_16. The decision module MII\_16 is then linked with the summing modules SII\_11 and SII\_21 corresponding to V011 and V032.

LITERATURE/REFERENCES (1) D. E. Muller, "Application of Boolean Algebra to Switching Circuit Design and to Error Detection," IRE Trans, EC-3: 6-12, September 1954.
(2) S. Reed, "A Class of Multiple-Error Correcting Codes and the Decoding Scheme," IRE Trans, IT-4: 38-49, September 1954.
(3) I. Dumer, "Recursive decoding and its performance for low-rate Reed-Muller codes," IEEE Trans, Inform. Theory, vol. 50, pp. 811-823, 2004.
(4) G. Schnabl and M. Bossert, "Soft-decision decoding of Reed-Muller codes as generalized multiple concatenated codes," IEEE Trans. Inform. Theory, vol. 41, pp. 304-308, 1995.
(5) S. Lin and D.J. Costello, "Error Control Coding: Fundamentals and Applications", Prentice-Hall, 1983.
(6) C.-L. Chen, "On majority-logic decoding of finite geometry codes," IEEE Trans. Inform. Theory, vol. 17, pp. 332-336, 1971.
(7) C.-L. Chen, "Note on majority-logic decoding of finite geometry codes," IEEE Trans. Inform. Theory, vol. 81, pp. 539-541, 1972.

The invention claimed is:

1. An arrangement for decoding a data word by use of a Reed-Muller or equivalent code, the arrangement comprising:
  (1) N input terminals, I1 to IN;
  (2) a first level of E·D summing modules, SI\_11 to SI\_ED, wherein each summing module of the first level is linked with F different input terminals and each input terminal is linked with E summing modules of the first level;
  (3) a first level of E decision modules, MI\_1 to MI\_E, wherein each of the D inputs of each decision module is linked with a respective output from D different summing modules from the first level of the summing modules;
  (4) a second level of H summing modules, SII\_1 to SII\_H, wherein each summing module is linked with a decision module from the first level of the decision modules and a summing module from the first level of the summing modules;
  (5) a second level of G decision modules, MII\_1 to MII\_G, wherein each of the E inputs of each decision module is linked with a respective output from E different summing modules from the second level of the summing modules;
  (6) a third level of G summing modules, SIII\_1 to SIII\_G, wherein each summing module is linked with exactly one decision module from the second level of the decision modules and an input terminal;
  (7) G output terminals, O1 to OG, wherein each output terminal is linked with exactly one summing module from the third level of the summing modules;
  wherein N denotes the length of the code and D denotes the minimum distance of the code, E is equal to D-2, F is equal to N/D, G is the number of the symbols of the data word that are to be corrected, and H is a natural number between 1 and E·D.

2. The arrangement according to claim 1, wherein H is equal to E·D.

3. The arrangement according to claim 1, wherein G is equal to N or G is equal to the dimension of the code.

4. The arrangement according to claim 1, wherein at least one summing module of the second level or third level is an XOR gate.

5. The arrangement according to claim 1, wherein at least one decision module of the second level is an AND gate.

6. The arrangement according to claim 1, wherein at least one summing module of the first level performs an odd-parity function.

7. The arrangement according to claim 1, wherein at least one decision module performs a majority function.

8. The arrangement according to claim 1, wherein at least one decision module or at least one summing module comprise(s) a logic gate or a quantum logic gate or an arrangement of a plurality of identical or different logic gates or quantum logic gates.

9. The arrangement according to claim 1, wherein at least one summing module of the second level and third level is an XOR gate.

10. The arrangement according to claim 1, wherein at least one decision module and at least one summing module comprises a logic gate and a quantum logic gate or an arrangement of a plurality of identical or different logic gates and quantum logic gates.

* * * * *